(12) United States Patent
Duffy et al.

(10) Patent No.: US 11,672,106 B2
(45) Date of Patent: Jun. 6, 2023

(54) CHASSIS WITH THERMAL TRANSFER FLUID PATH

(71) Applicant: Hamilton Sundstrand Corporation, Charlotte, NC (US)

(72) Inventors: Jason C. Duffy, Granby, CT (US); Kenneth J. Trotman, Granby, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 82 days.

(21) Appl. No.: 17/360,839

(22) Filed: Jun. 28, 2021

(65) Prior Publication Data

US 2022/0418170 A1    Dec. 29, 2022

(51) Int. Cl.
*H05K 7/20* (2006.01)
*B64D 37/34* (2006.01)
*H05K 5/02* (2006.01)

(52) U.S. Cl.
CPC ......... *H05K 7/20872* (2013.01); *B64D 37/34* (2013.01); *H05K 7/20272* (2013.01); *H05K 5/0291* (2013.01); *H05K 7/20636* (2013.01)

(58) Field of Classification Search
CPC .......... H05K 7/20218; H05K 7/20254; H05K 7/20872; H05K 5/0286–0291; B64D 37/34; G06F 1/20; H01L 23/473
See application file for complete search history.

(56) References Cited

U.S. PATENT DOCUMENTS

| | | | |
|---|---|---|---|
| 4,701,829 A | 10/1987 | Bricaud et al. | |
| 4,962,444 A * | 10/1990 | Niggemann | H05K 7/20645 257/714 |
| 5,057,968 A * | 10/1991 | Morrison | H05K 7/20936 361/802 |
| 6,625,023 B1 | 9/2003 | Morrow et al. | |
| 7,876,562 B2 * | 1/2011 | Visser | H05K 7/20927 138/40 |
| 9,107,293 B2 * | 8/2015 | Fitz-Patrick | B22D 19/04 |
| 9,468,131 B2 * | 10/2016 | Brandt | H05K 7/20254 |
| 9,999,156 B2 | 6/2018 | Holahan et al. | |
| 10,602,635 B2 | 3/2020 | Ditri et al. | |
| 2011/0267776 A1 * | 11/2011 | Porreca | H05K 7/1404 361/720 |

(Continued)

FOREIGN PATENT DOCUMENTS

EP    0697807 A2    2/1996

OTHER PUBLICATIONS

Extended European Search Report dated Oct. 10, 2022, for corresponding European Application No. 22170365.5.

*Primary Examiner* — Zachary Pape
(74) *Attorney, Agent, or Firm* — Kinney & Lange, P.A.

(57) ABSTRACT

A chassis includes top rails extending along a top side of the chassis, bottom rails extending along a bottom side of the chassis, a fluid inlet connected to the chassis that is configured to receive a thermal transfer fluid, and a fluid outlet connected to the chassis that is configured to discharge the thermal transfer fluid. The chassis further includes a thermal transfer fluid path extending between and fluidly coupled to the fluid inlet and the fluid outlet, wherein the thermal transfer fluid is configured to flow through the thermal transfer fluid path, and wherein the thermal transfer fluid path extends in a serpentine pattern through at least one of the top rails and through at least one of the bottom rails.

18 Claims, 8 Drawing Sheets

(56) References Cited

U.S. PATENT DOCUMENTS

2015/0305198 A1 10/2015 Brandt et al.
2020/0100388 A1* 3/2020 Hernandez-Toledo ...................... H05K 7/20636

* cited by examiner

CHASSIS WITH THERMAL TRANSFER FLUID PATH

STATEMENT OF GOVERNMENT INTEREST

This invention was made with government support under N00019-17-G-0005 awarded by the United States Navy. The government has certain rights in the invention.

BACKGROUND

The present disclosure relates to a chassis for circuit cards, and in particular, to a thermal transfer fluid path in a chassis for circuit cards.

Thermal management of aircraft mounted electronic components is becoming increasingly more challenging with the higher density of more powerful, but smaller electronic components. Electronic components are held on circuit cards that mechanically support and electrically connect the electronic components. Electronic components on the circuit cards generate heat and require thermal management. High heat can damage circuit cards and limit the life of the circuit cards. High heat can also damage the electronic components and cause them to become unreliable. For these reasons, cooling systems and devices are needed to remove heat from circuit cards.

Due to space limitations on aircraft, circuit cards are typically stacked in a chassis or housing. The chassis or housing also acts as a cooling apparatus for the circuit cards. Heat can transfer through the circuit cards to the chassis or housing and can then be dispelled into an ambient environment.

SUMMARY

A chassis includes top rails extending along a top side of the chassis, bottom rails extending along a bottom side of the chassis, a fluid inlet connected to the chassis that is configured to receive a thermal transfer fluid, and a fluid outlet connected to the chassis that is configured to discharge the thermal transfer fluid. The chassis further includes a thermal transfer fluid path extending between and fluidly coupled to the fluid inlet and the fluid outlet, wherein the thermal transfer fluid is configured to flow through the thermal transfer fluid path, and wherein the thermal transfer fluid path extends in a serpentine pattern through at least one of the top rails and through at least one of the bottom rails.

A chassis includes a plurality of top rails extending along a top side of the chassis, a plurality of bottom rails extending along a bottom side of the chassis, a fluid inlet connected to the chassis that is configured to receive a thermal transfer fluid, and a fluid outlet connected to the chassis that is configured to discharge the thermal transfer fluid. The chassis further includes a thermal transfer fluid path extending between and fluidly coupled to the fluid inlet and the fluid outlet, wherein the thermal transfer fluid is configured to flow through the thermal transfer fluid path from the fluid inlet to the fluid outlet. The thermal transfer fluid path further includes a top serpentine passage extending in a serpentine pattern through the top side of the chassis, a bottom serpentine passage extending in a serpentine pattern through the bottom side of the chassis, and a connecting passage extending through a second side of the chassis and fluidly coupling the top serpentine passage to the bottom serpentine passage.

A method of thermally managing components in a chassis includes providing a thermal transfer fluid to a fluid inlet fluidly coupled to a thermal transfer fluid path in the chassis, and flowing the thermal transfer fluid in a serpentine pattern through the thermal transfer fluid path in the chassis. The method further includes transferring heat from an electronic component on a circuit card held in the chassis and into the thermal transfer fluid flowing through the thermal transfer fluid path in the chassis, and discharging the thermal transfer fluid from the thermal transfer fluid path through a fluid outlet fluidly coupled to the thermal transfer fluid path in the chassis.

DETAILED DESCRIPTION

Figure 1:
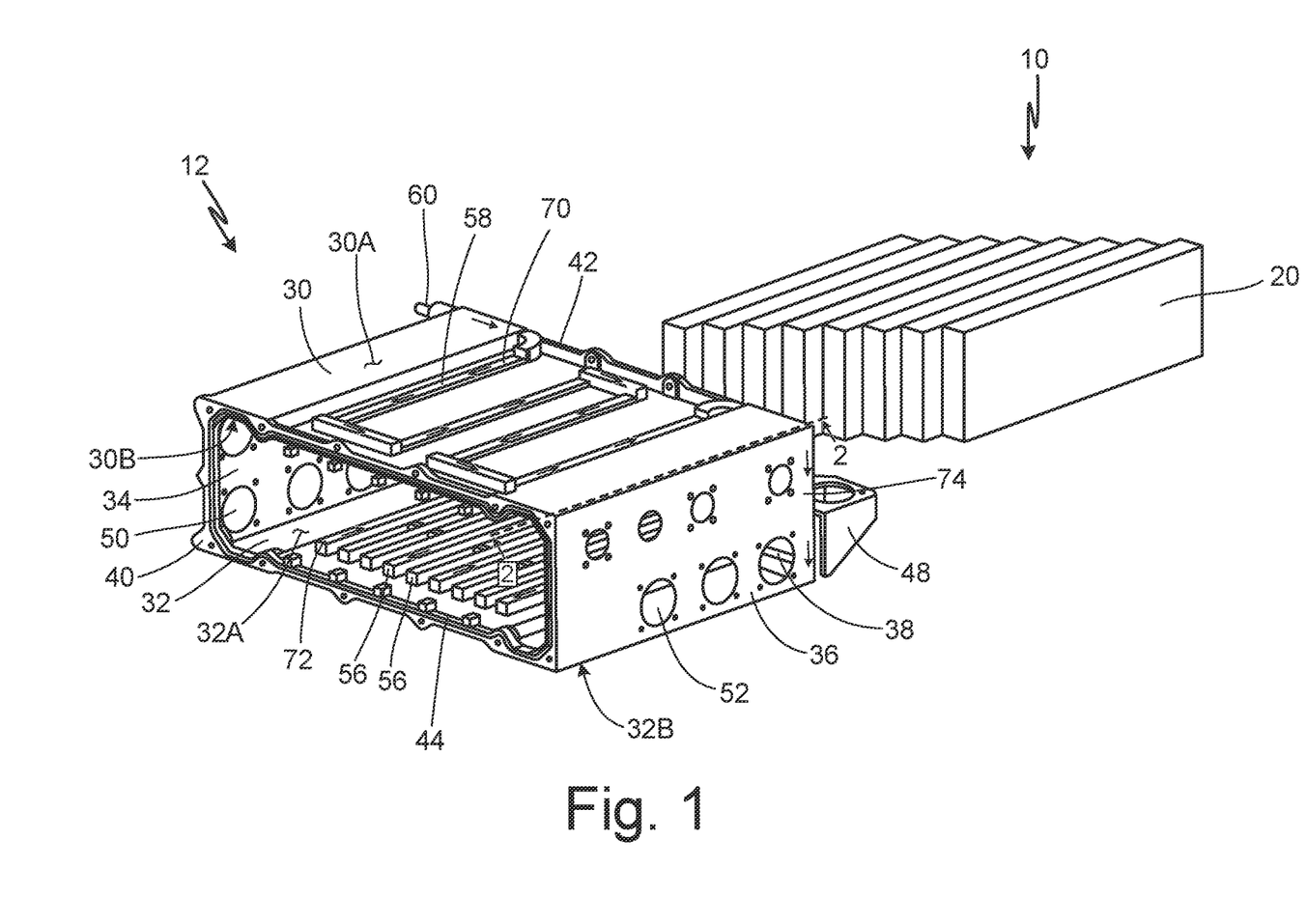
FIG. 1 is an exploded isometric view of a chassis and circuit cards.
Figure 2:
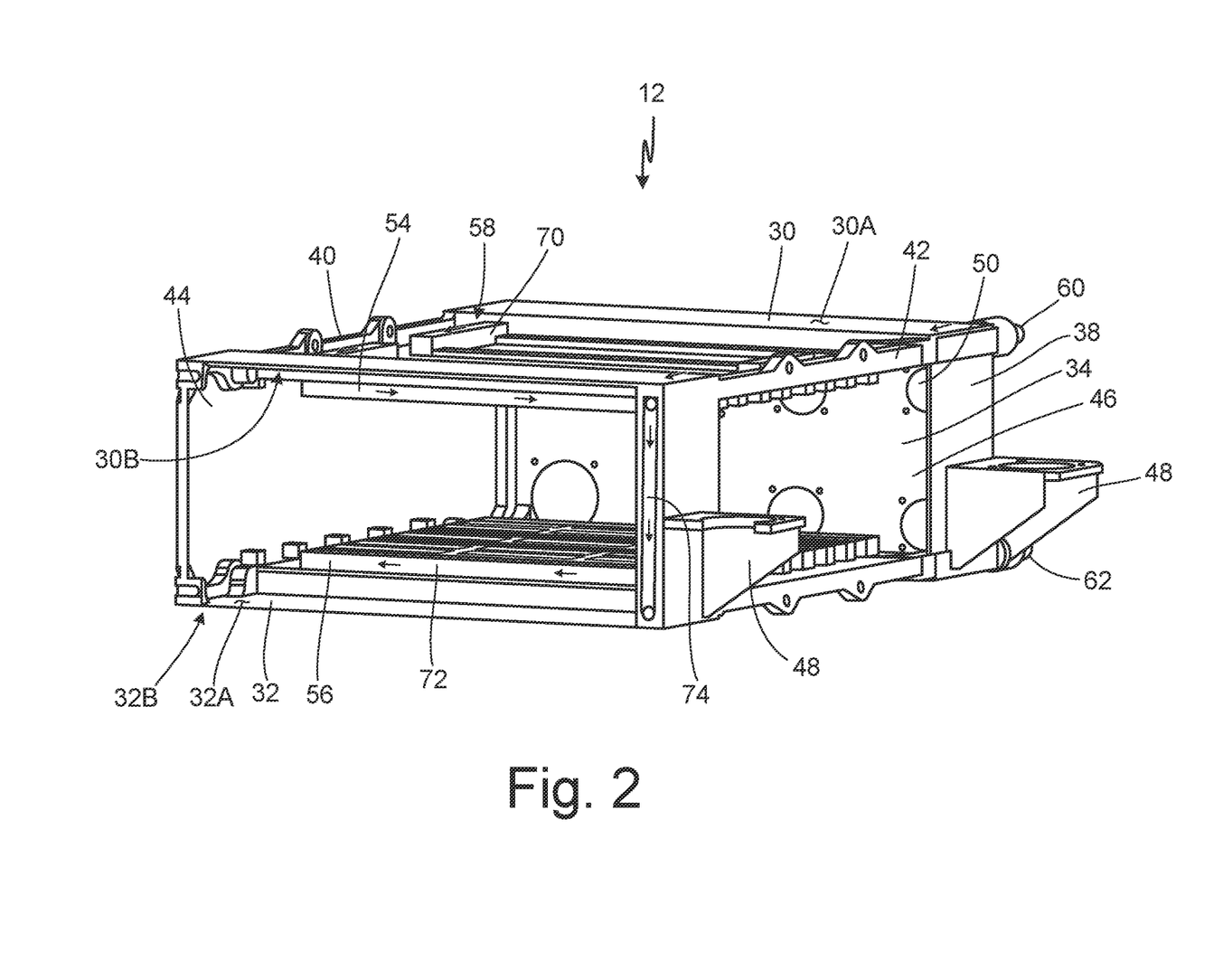
FIG. 2 is a side cross-sectional isometric view of the chassis taken along a plane passing through line 2-2 of FIG. 1.

FIG. 1 is an exploded isometric view of chassis 12 and circuit cards 10. FIG. 2 is a side cross-sectional isometric view of chassis 12 taken along a plane passing through line 2-2 of FIG. 1. FIGS. 1-2 will be discussed together. FIG. 1 shows circuit cards 10 that each include board 20. FIGS. 1-2 show chassis 12 that includes top side 30 (including top surface 30A and bottom surface 30B), bottom side 32 (including top surface 32A and bottom surface 32B), first side 34, second side 36, back side 38, front mounting flange 40, back mounting flange 42, opening 44, opening 46, isolator brackets 48, first plurality of openings 50, second plurality of openings 52, top rails 54 (including top rails 54A-54I), bottom rails 56 (including bottom rails 56A-56I), thermal transfer fluid path 58, fluid inlet 60, and fluid outlet 62. Thermal transfer fluid path 58 includes top serpentine passage 70, bottom serpentine passage 72, and connecting passage 74.

As shown in FIG. 1, circuit cards 10 are used in aircraft computers. Circuit cards 10 are positioned in chassis 12, which can be mounted to an aircraft engine. Specifically, chassis 12 can be mounted to an engine core, a fan, or any other suitable part of an aircraft engine. Circuit cards 10 are configured to hold one or more electronic components. Circuit cards 10 can also be referred to as printed circuit boards or printed wiring boards. Circuit cards 10 are configured to be slid into chassis 12. Circuit cards 10 each include board 20 on which the one or more electronic components can be positioned.

Chassis 12 is made out of aluminum in the embodiment shown in FIGS. 1-2. In alternate embodiments, chassis 12 can be made out of any material that is capable of exchanging heat between circuit cards 10 and chassis 12. The one or more electronic components mounted on circuit cards 10 can generate high amounts of heat that need to be dissipated out of circuit cards 10 and through chassis 12 to extend the life of the electronic components and circuit cards 10 and meet reliability requirements for aircraft components. Further, in cold applications, heat can be transferred from chassis 12 into circuit cards 10 to heat the electronic components to meet reliability requirements for aircraft components.

Chassis 12 includes top side 30 opposite of bottom side 32. Top side 30 includes top surface 30A opposite of bottom surface 30B. Bottom side 32 includes top surface 32A opposite of bottom surface 32B. First side 34 extends between top side 30 and bottom side 32, and second side 36 extends between top side 30 and bottom side 32. First side 34 is opposite of second side 36. Chassis 12 further includes back side 38 on a back end of chassis 12.

Chassis 12 also includes front mounting flange 40 on a front end and back mounting flange 42 on a back end. Opening 44 is positioned at front end of chassis 12 within front mounting flange 40. Front mounting flange 40 includes a groove for receiving an o-ring and a plurality of mounting holes. A front plate is configured to be mounted on front mounting flange 40. An o-ring can be positioned in a groove in front mounting flange 40 to provide a seal between front mounting flange 40 and the front plate. Opening 46 is positioned at back end of chassis 12 within back side 38 and back mounting flange 42. Back mounting flange 42 includes a plurality of mounting holes. A back plate is configured to be mounted on back mounting flange 40. Isolator brackets 48 are positioned on back side 38. A first isolator bracket 48 is positioned adjacent to first side 34, and a second isolator bracket 48 is positioned adjacent to second side 36. Two additional isolator brackets 48 can optionally be positioned on the back plate. Isolator brackets 48 are used to mount chassis 12 to an aircraft engine. In alternate embodiments, any number of isolator brackets 48 can be included on chassis 12 and isolator brackets 48 can be positioned on any side of chassis 12.

First plurality of openings 50 extend through first side 34, and second plurality of openings 52 extend through second side 36. First plurality of openings 50 and second plurality of openings 52 each include a plurality of circular openings that are configured to act as passageways for electrical wires. When circuit cards 10 are positioned in chassis 12 and connected to a motherboard in chassis 12, wires can extend from the motherboard and/or other electronic boards in chassis 12 through first plurality of openings 50 and/or second plurality of openings 52 to electronic components outside of chassis 12. Wire conduits can also be positioned in first plurality of openings 50 and second plurality of openings 52 to facilitate the passages of wires from electronic boards inside of chassis 12 to electronic components outside of chassis 12.

Chassis 10 further includes top rails 54 extending along bottom surface 30B of top side 30 and bottom rails 56 extending along top surface 32A of bottom side 32. Top rails 54 and bottom rails 56 extend from a front end to a back end of chassis 12 along top side 30 and bottom side 32, respectively. Top rails 54 and bottom rails 56 are configured to act as guides and supports for circuit cards 10, which can be slid into chassis 12 along top rails 54 and bottom rails 56.

The one or more electronic components positioned on circuit cards 10 can generate a lot of heat, so chassis 12 needs to be designed to dissipate heat out of circuit cards 10 and chassis 12. Further, in cold applications, the electronic components positioned on circuit cards 10 may need to be warmed. Thermal transfer fluid path 58 is included in chassis 12 to dissipate heat out of circuit cards 10 and chassis 12 into a thermal transfer fluid flowing through thermal transfer fluid path 58 or transfer heat from the thermal transfer fluid flowing through thermal transfer fluid path 58 into chassis 12 and circuit cards 10. Thermal transfer fluid path 58 is shown with arrows in FIGS. 1-2. Thermal transfer fluid path 58 extends partially through top rails 54 and bottom rails 56. Thermal transfer fluid path 58 extends from fluid inlet 60 to fluid outlet 62. Fluid inlet 60 and fluid outlet 62 are positioned on first side 34 of chassis 12. In the embodiment shown in FIGS. 1-2, fluid inlet 60 is positioned adjacent top side 30 of chassis 12, and fluid outlet 62 is positioned adjacent a bottom side 32 of chassis 12. In alternate embodiments, fluid inlet 60 can be positioned adjacent bottom side 32 of chassis 12 and fluid outlet 62 can be positioned adjacent top side 30 of chassis 12. Alternatively, fluid inlet 60 and fluid outlet 62 can be positioned on any side of chassis 12.

Thermal transfer fluid path 58 includes top serpentine passage 70, bottom serpentine passage 72, and connecting passage 74. Fluid inlet 60 is fluidly connected to top serpentine passage 70. Top serpentine passage 70 is a fluid path that extends in a serpentine pattern through top side 30 of chassis 12. Top serpentine passage 70 extends partially through top rails 54. Fluid outlet 62 is fluidly connected to bottom serpentine passage 72. Bottom serpentine passage 72 is a fluid path that extends in a serpentine pattern through bottom side 32 of chassis 12. Bottom serpentine passage 72 extends partially through bottom rails 56. Top serpentine passage 70 is fluidly connected to bottom serpentine passage 72 with connecting passage 74. Connecting passage 74 is a fluid path that extends from top side 30 to bottom side 32 through second side 36.

A thermal transfer fluid enters thermal transfer fluid path 58 through fluid inlet 60, flows in a serpentine pattern through top serpentine passage 70 across top side 30 of chassis 12, flows through connecting passage 74 in second side 36 from top side 30 to bottom side 32, flows in a serpentine pattern through bottom serpentine passage 72 across bottom side 32 of chassis 12, and exits chassis 12 at fluid outlet 62. The thermal transfer fluid is fuel in the embodiment shown in FIGS. 1-2, but can be any suitable fluid in alternate embodiments.

Figure 3A:
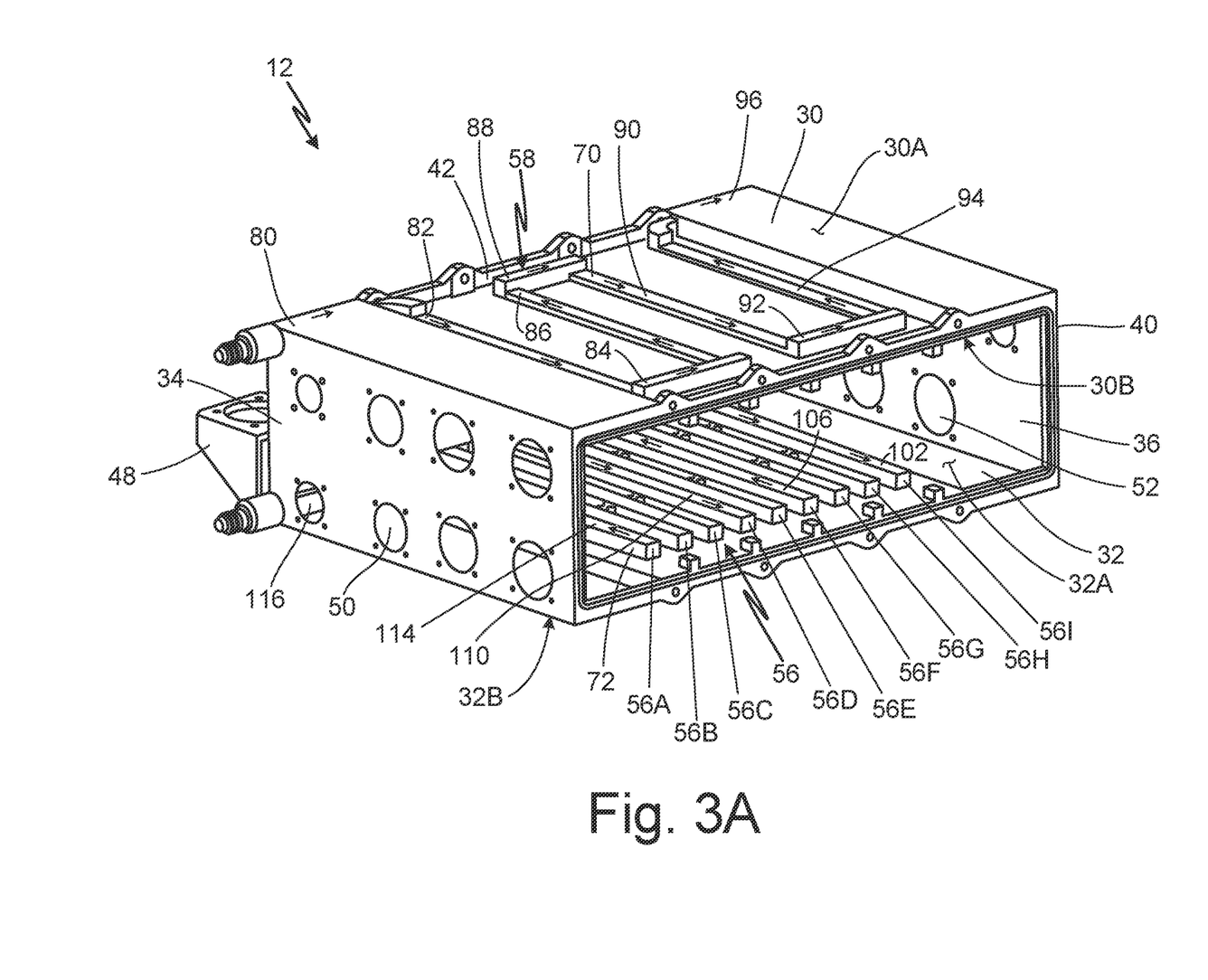
FIG. 3A is a front isometric view of the chassis.
Figure 3B:
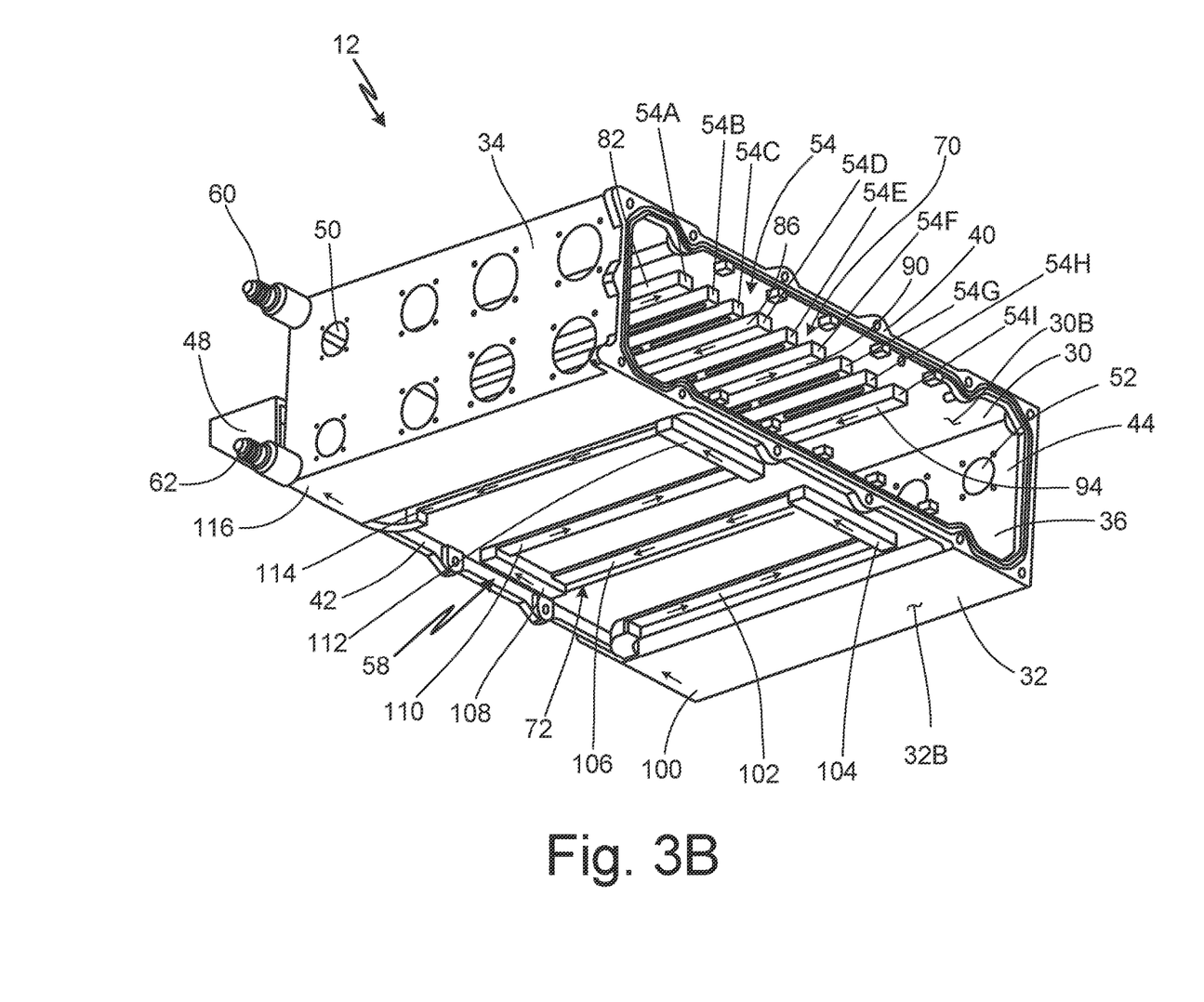
FIG. 3B is a bottom isometric view of the chassis.
Figure 3C:
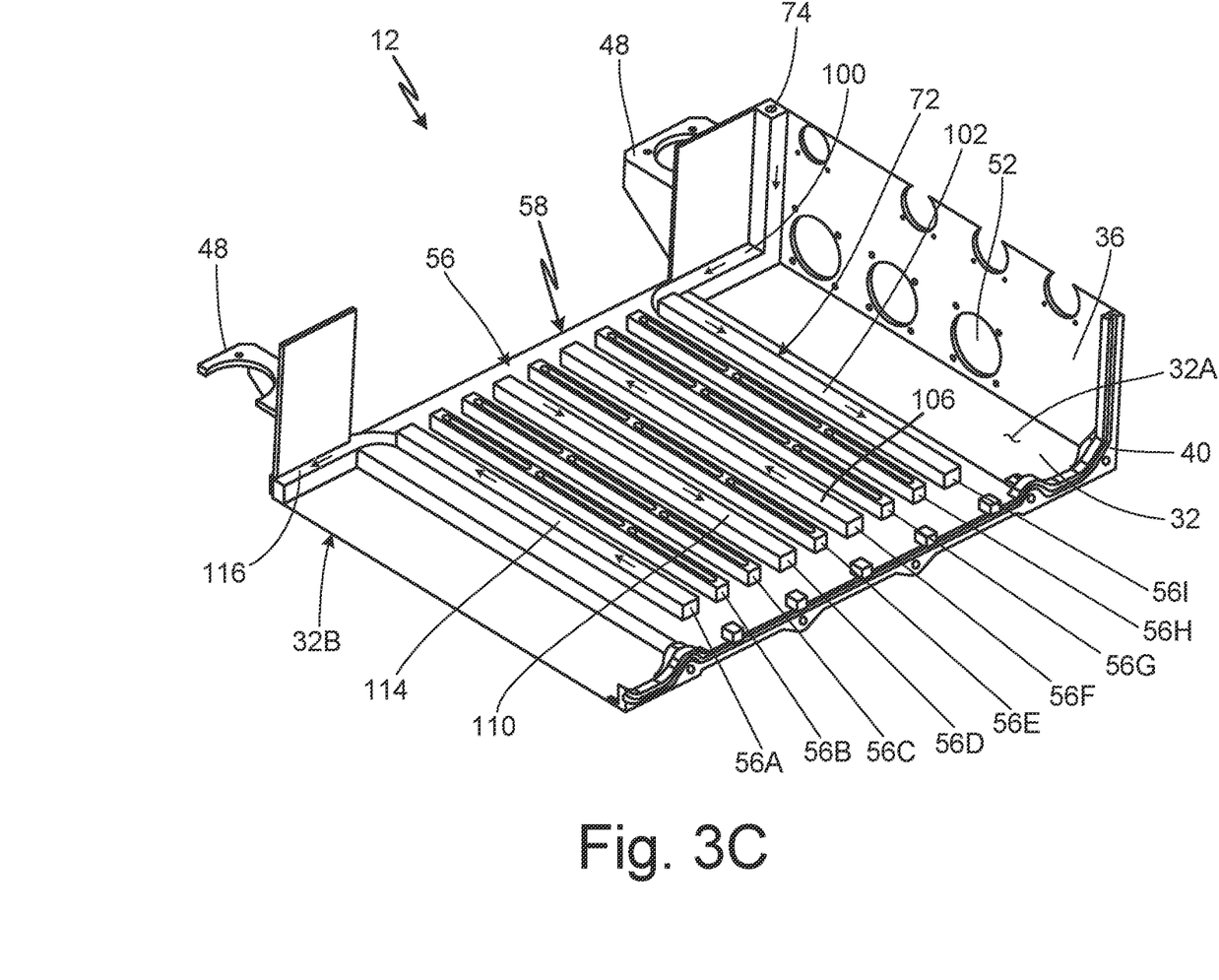
FIG. 3C is a front multi-sectional isometric view of the chassis.

FIG. 3A is a front isometric view of chassis 12. FIG. 3B is a bottom isometric view of chassis 12. FIG. 3C is a front multi-sectional isometric view of chassis 12, in which the top side 30 and first side 34 have been removed. FIGS. 3A-3C will be discussed together. Chassis 12 includes top side 30 (including top surface 30A and bottom surface 30B), bottom side 32 (including top surface 32A and bottom surface 32B), first side 34, second side 36, back side 38, front mounting flange 40, back mounting flange 42, opening 44, opening 46, isolator brackets 48, first plurality of openings 50, second plurality of openings 52, top rails 54 (including top rails 54A-54I), bottom rails 56 (including bottom rails 56A-56I), thermal transfer fluid path 58, fluid inlet 60, and fluid outlet 62. Thermal transfer fluid path 58 includes top serpentine passage 70, bottom serpentine passage 72, and connecting passage 74.

Chassis 12 has the structure and design as discussed above in reference to FIGS. 1-2. As shown in FIGS. 3A-3C, top rails 54 include nine rails, including top rails 54A-54I, and bottom rails 56 includes nine rails, including bottom rails 56A-56I. Any suitable number of top rails 54 and bottom rails 56 can be included in alternate embodiments. Thermal transfer fluid path 58 is shown with arrows in FIGS. 3A-3C. Thermal transfer fluid path 58 will be discussed in greater detail here with respect to FIGS. 3A-3C.

Top serpentine passage 70 includes inlet passage 80 (shown in FIG. 3A), first rail passage 82 (shown in FIGS. 3A-3B), first raised passage 84 (shown in FIG. 3A), second rail passage 86 (shown in FIGS. 3A-3B), second raised passage 88 (shown in FIG. 3A), third rail passage 90 (shown in FIGS. 3A-3B), third raised passage 92 (shown in FIG. 3A), fourth rail passage 94 (shown in FIGS. 3A-3B), and connecting passage 96 (shown in FIG. 3A) that are fluidly connected to form a serpentine pattern across top side 30 of chassis 12. Top serpentine passage 70 extends partially through top rails 54, specifically top rails 54A, 54D, 54F, and 54I.

As shown in FIGS. 3A-3B, inlet passage 80 extends through top side 30 from fluid inlet 60 on first side 34 of chassis 12 to first rail passage 82. First rail passage 82 extends through top rail 54A from inlet passage 80 to first raised passage 84. First raised passage 84 extends through a raised portion of top side 30 from first rail passage 82 to second rail passage 86. Second rail passage 86 extends through top rail 54D from first raised passage 84 to second raised portion 88. Second raised portion 88 extends through a raised portion of top side 30 from second rail passage 86 to third rail passage 90. Third rail passage 90 extends through top rail 54F from second raised portion 88 to third raised passage 92. Third raised passage 92 extends through a raised portion of top side 30 from third rail passage 90 to fourth rail passage 94. Fourth rail passage 94 extends through top rail 54I from third raised passage 92 to connecting passage 96. Connecting passage 96 extends through top side 30 from fourth rail passage 94 to connecting passage 74.

First raised passage 84, second raised passage 88, and third raised passage 92 are raised upwards from top surface 30A of top side 30 of chassis 12. First raised passage 84, second raised passage 80, and third raised passage 92 are raised upwards from top side 30 of chassis 12 to connect top rails 54A, 54D, 54F, and 54I while still allowing circuit cards 10 to be slid into chassis 12 along top rails 54.

Bottom serpentine passage 72 includes connecting passage 100 (shown in FIGS. 3B-3C), fifth rail passage 102 (shown in FIGS. 3A-3C), fourth raised passage 104 (shown in FIG. 3B), sixth rail passage 106 (shown in FIGS. 3A-3C), fifth raised passage 108 (shown in FIG. 3B), seventh rail passage 110 (shown in FIGS. 3A-3C), sixth raised passage 112 (shown in FIG. 3B), eighth rail passage 114 (shown in FIGS. 3A-3C), and outlet passage 116 (shown in FIGS. 3B-3C) that are fluidly connected to form a serpentine pattern across bottoms side 32 of chassis 12. Bottom serpentine passage 72 extends partially through bottom rails 56, specifically bottom rails 56A, 56D, 56F, and 56I.

As shown in FIGS. 3A-3C, connecting passage 100 extends through bottom side 32 from connecting passage 74 to fifth rail passage 102. Fifth rail passage 102 extends through bottom rail 56I from connecting passage 100 to fourth raised passage 104. Fourth raised passage 104 extends through a raised portion of bottom side 32 from fifth rail passage 102 to sixth rail passage 106. Sixth rail passage 106 extends through bottom rail 56F from fourth raised passage 104 to fifth raised portion 108. Fifth raised portion 108 extends through a raised portion of bottom side 32 from sixth rail passage 106 to seventh rail passage 110. Seventh rail passage 110 extends through bottom rail 56D from fifth raised portion 108 to sixth raised passage 112. Sixth raised passage 112 extends through a raised portion of bottom side 32 from seventh rail passage 110 to eighth rail passage 114. Eighth rail passage 114 extends through bottom rail 56A from sixth raised passage 112 to outlet passage 116. Outlet passage 116 extends through bottom side 32 from eighth rail passage 114 to fluid outlet 62.

Fourth raised passage 104, fifth raised passage 108, and sixth raised passage 112 are raised downwards from bottom surface 32B of bottom side 32 of chassis 12. Fourth raised passage 104, fifth raised passage 108, and sixth raised passage 112 are raised downwards from bottom side 32 of chassis 12 to connect bottom rails 56A, 56D, 56F, and 56I while still allowing circuit cards 10 to be slid into chassis 12 along bottom rails 56.

As a thermal transfer fluid, for example fuel, flows through thermal transfer fluid path 58, heat can transfer from electronic components on circuit cards 10, through circuit cards 10, into chassis 12, and then into the thermal transfer fluid flowing through thermal transfer fluid path 58. The thermal transfer fluid flowing through thermal transfer fluid path 58 is at a lower temperature than chassis 12 and will absorb heat from chassis 12. The thermal transfer fluid will then flow out of chassis 12 to dissipate the heat from chassis 12.

Chassis 12 can also be used in cold applications where the electronic components in chassis 12 need to be heated to ensure proper function of the electronic components. As the thermal transfer fluid flows through thermal transfer path 58, heat can transfer from the thermal transfer fluid into chassis 12, through circuit cards 10, and into the electronic components on circuit cards 10. The thermal transfer fluid flowing through thermal transfer fluid path 58 is at a higher temperature than chassis 12 and will transfer heat into chassis 12. The thermal transfer fluid will flow through chassis 12 to continuously warm chassis 12.

Integrating part of thermal transfer fluid path 58 into top rails 54 and bottom rails 56 allows for more direct heat transfer between circuit cards 10 and the thermal transfer fluid in thermal transfer fluid path 58. Circuit cards 10 are held against top rails 54 and bottom rails 56, so flowing the thermal transfer fluid through top rails 54 and bottom rails 56 allows the thermal transfer fluid to flow through chassis 12 near circuit cards 10 to absorb heat from or transfer heat to circuit cards 10. Further, heat from circuit cards 10 can be transferred through any part of chassis 12 into the thermal transfer fluid flowing through thermal transfer fluid path 58.

Chassis typically are cooled with external air flowing around the chassis. Integrating thermal transfer fluid path 58 in chassis 12 allows chassis 12 to be used in applications where air cooling is not an option or in high heat areas where air cooling is insufficient to cool chassis 12. Thermal transfer fluid path 58 maximizes the amount of heat that can be transferred out of chassis 12 and minimizes the weight and complexity of chassis 12. Thermal transfer fluid path 58 also remains physically isolated from the sensitive electronic components on circuit boards 10 and, as such, does not interfere with the electronic components.

Figure 4A:
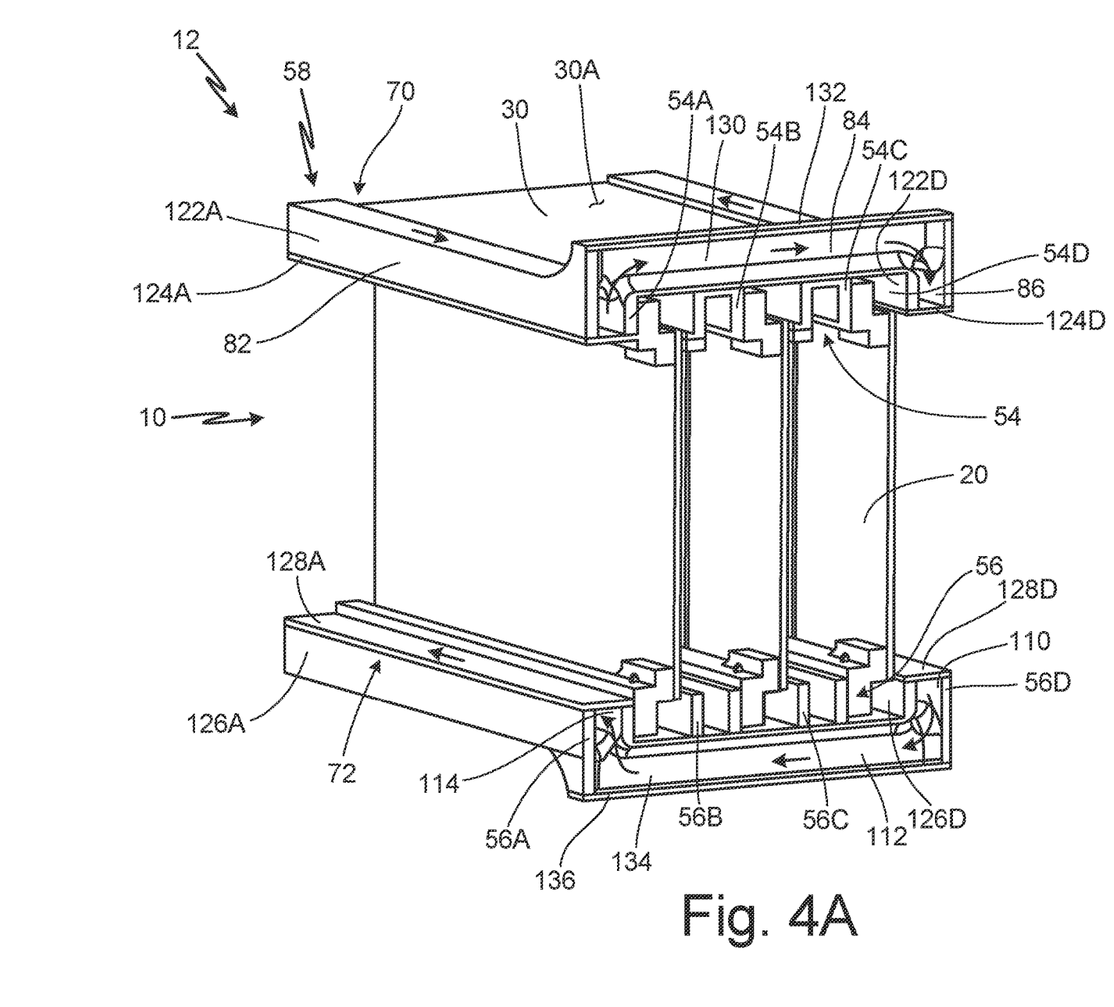
FIG. 4A is a front isometric view of a first portion of the chassis and circuit cards.
Figure 4B:
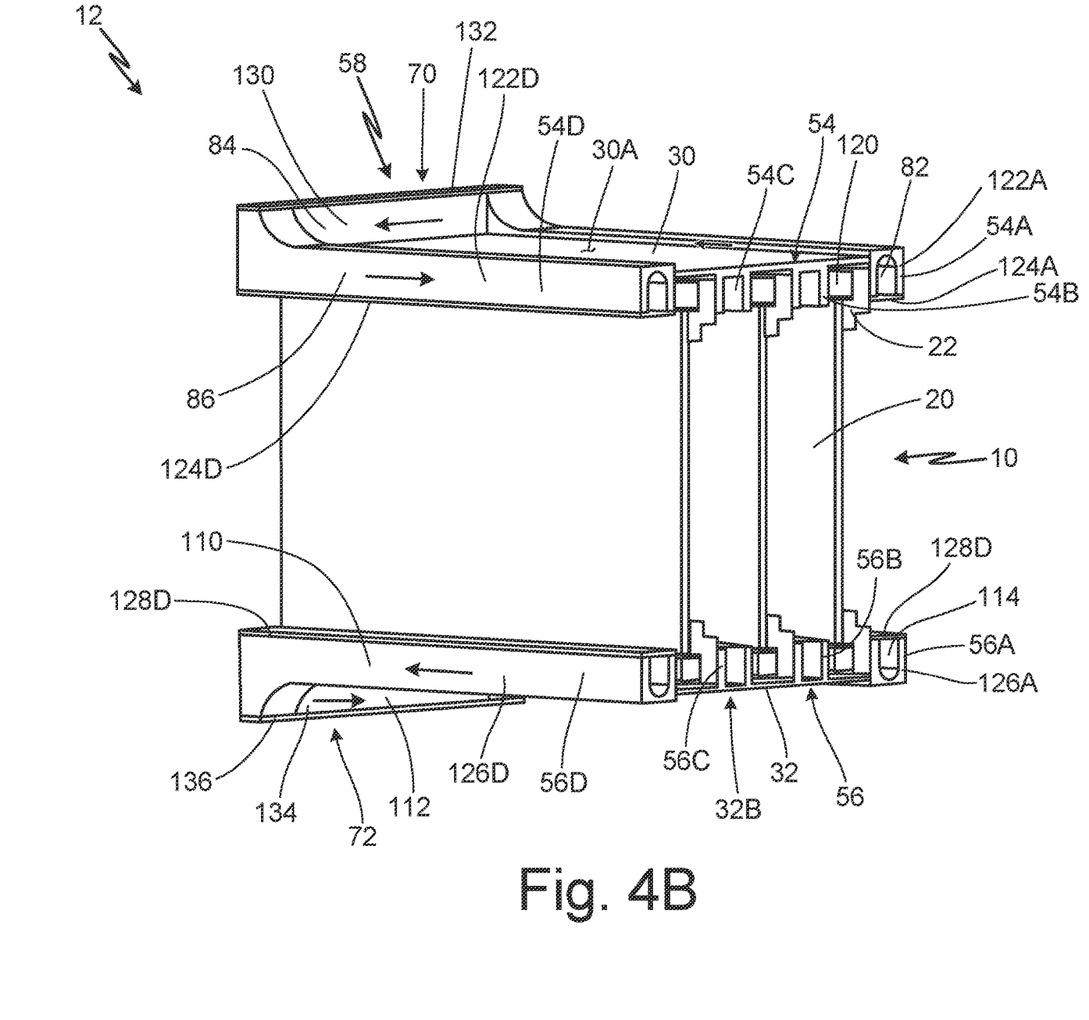
FIG. 4B is a back isometric view of the first portion of the chassis and circuit cards.

FIG. 4A is a front isometric view of a first portion of chassis 12 and circuit cards 10. FIG. 4B is a back isometric view of the first portion of chassis 12 and circuit cards 10. FIGS. 4A-4B will be discussed together. Circuit cards 10 each include board 20. Chassis 12 includes top side 30 (including top surface 30A and bottom surface 30B), bottom side 32 (including top surface 32A and bottom surface 32B), top rails 54 (including top rails 54A-54D), bottom rails 56 (including bottom rails 56A-56D), and thermal transfer fluid path 58. Thermal transfer fluid path 58 includes top serpentine passage 70 and bottom serpentine passage 72. Top serpentine passage 70 includes first rail passage 82, first raised passage 84, and second rail passage 86. Bottom serpentine passage 72 includes seventh rail passage 110, sixth raised passage 112, and eighth rail passage 114. FIGS. 4A-4B further show wedge locks 120. Top rails 54A and 54D include integral portions 122A and 122D and plates 124A and 124D, respectively. Bottom rails 56A and 56D include integral portions 126A and 126D and plates 128A and 128D, respectively. Chassis 12 further includes raised portion 130, plate 132, raised portion 134, and plate 136.

Circuit cards 10 and chassis 12 have the structure and design as discussed above in reference to FIGS. 1-3C. FIGS. 4A-4B show a first portion of circuit cards 10 and chassis 12. Specifically, FIGS. 4A-4B show a portion of circuit cards 10 and chassis 12 that includes partial views of top rails 54A-54D and 56A-56D.

Circuit cards 10 are held in chassis 12 and positioned against top rails 54 and bottom rails 56. Circuit cards 10 each include board 20 on which electronic components are positioned. As shown in FIG. 4B, circuit boards 10 are held in place and pushed against top rails 54 and bottom rails 56 with wedge locks 120.

Top rails 54A and 54D and bottom rails 56A and 56D form a portion of thermal transfer fluid path 58. Specifically, top rails 54A and 54D form a portion of top serpentine passage 70, and bottom rails 56A and 56D form a portion of bottom serpentine passage 72. Top rails 54A and 54D and bottom rails 56A and 56D includes passages through which a thermal transfer fluid can flow. Top rails 54A and 54D include integral portions 122A and 122D, respectively, that are integrally formed with chassis 12. Plates 124A and 124D are positioned on and attached (for example, by dip braze, vacuum braze, or any other suitable fabrication method) to integral portions 122A and 122D of top rails 54A and 54D to form first rail passage 82 and second rail passage 86, respectively. Bottom rails 56A and 56D include integral portions 126A and 126D, respectively, that are integrally formed with chassis 12. Plates 128A and 128D are positioned on and attached (for example, by dip braze, vacuum braze, or any other suitable fabrication method) to integral portions 126A and 126D of bottom rails 56A and 56D to form eight rail passage 114 and seventh rail passage 110, respectively. Top rails 54F and 54I and bottom rails 56F and 56I (shown in FIGS. 1-3C) have the same structure and design to form third rail passage 90, fourth rail passage 94, sixth rail passage 106, and fifth rail passage 102 (shown in FIGS. 1-3C), respectively.

Chassis 12 includes raised portion 130 extending upwards from top surface 30A of top side 30 and integrally formed with chassis 12. Plate 132 is positioned on and attached (for example, by dip braze, vacuum braze, or any other suitable fabrication method) to raised portion 130 to form first raised passage 84. First raised passage 84 is fluidly coupled to first rail passage 82 and second rail passage 86 to allow the thermal transfer fluid to flow from first rail passage 82, through first raised passage 84, and into second rail passage 86. Chassis 12 also includes raised portion 134 extending downwards from bottom surface 32B of bottom side 32 and integrally formed with chassis 12. Plate 136 is positioned on and attached (for example, by dip braze, vacuum braze, or any other suitable fabrication method) to raised portion 134 to form sixth raised passage 112. Sixth raised passage 112 is fluidly coupled to seventh rail passage 110 and eighth rail passage 114 to allow the thermal transfer fluid to flow from seventh rail passage 110, through sixth raised passage 112, and into eighth rail passage 114. Second raised passage 88 and third raised passage 92 (shown in FIGS. 1-3C) have the same structure and design as first raised passage 84, and fourth raised passage 104 and fifth raised passage 108 (shown in FIGS. 1-3C) have the same structure and design as sixth raised passage 112.

First raised passage 84 and sixth raised passage 112 are positioned in raised portion 130 and raised portion 134, respectively, to allow circuit cards to be slid into and out of chassis 12 along top rails 54 and bottom rails 56 while also allowing for fluid coupling between top rails 54A and 54D and bottom rails 56A and 56D. This also allows for industry standard wedge locks 120 to be used to push circuit cards 10 against top rails 54 and bottom rails 56. Pushing circuit cards 10 against top rails 54 and bottom rails 56 allows for better heat transfer between circuit cards 10 and chassis 12, specifically top rails 54 and bottom rails 56 that form a portion of thermal transfer fluid path 58. This improves the heat transfer between circuit cards 10 and the thermal transfer fluid flowing through thermal transfer fluid path 58.

Figure 5:
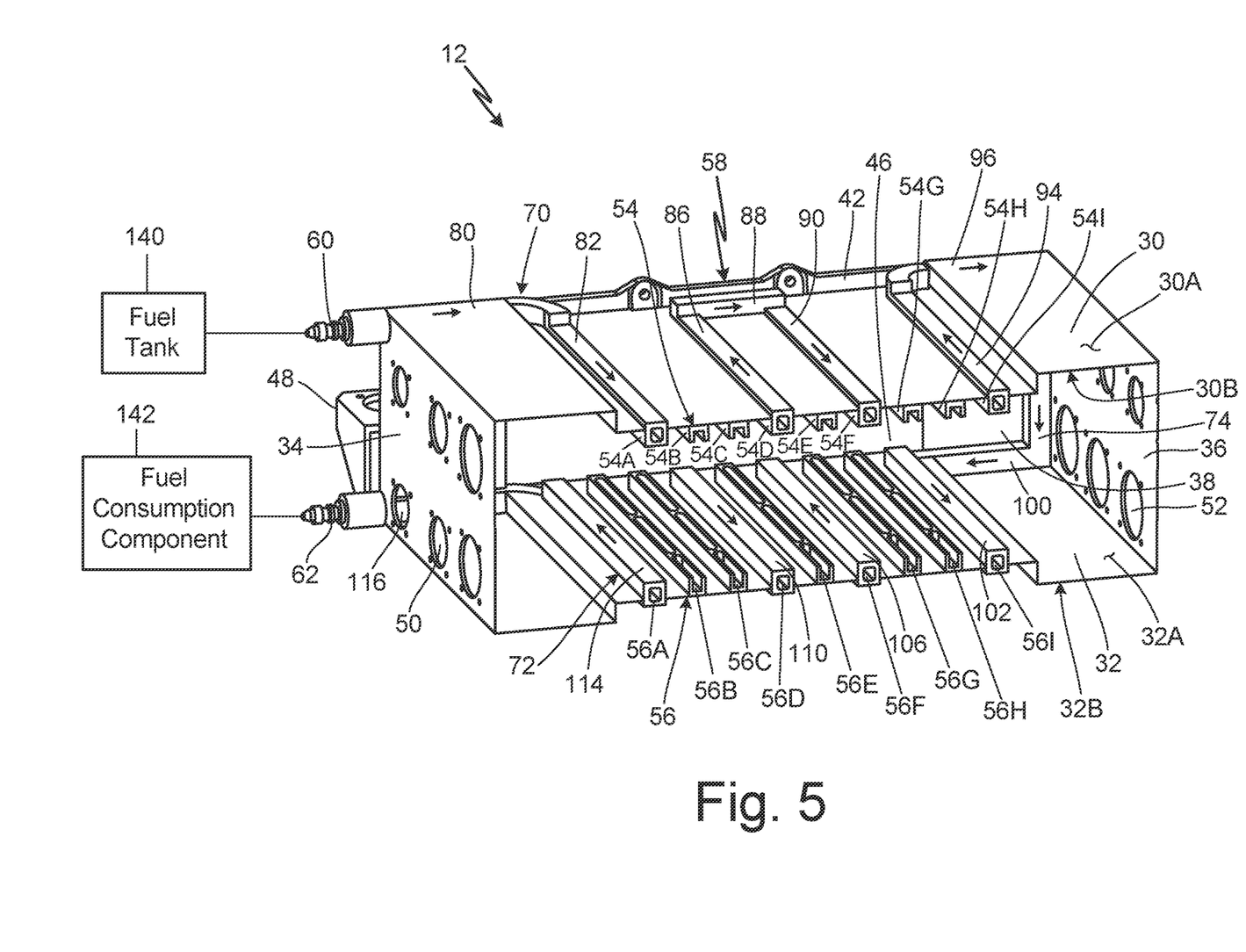
FIG. 5 is a front cross-sectional isometric view of the chassis.

FIG. 5 is a front cross-sectional isometric view of chassis 12. Chassis 12 includes top side 30 (including top surface 30A and bottom surface 30B), bottom side 32 (including top surface 32A and bottom surface 32B), first side 34, second side 36, back side 38, front mounting flange 40, back mounting flange 42, opening 44 (not shown in FIG. 5), opening 46, isolator brackets 48, first plurality of openings 50, second plurality of openings 52, top rails 54 (including top rails 54A-54I), bottom rails 56 (including bottom rails 56A-56I), thermal transfer fluid path 58, fluid inlet 60, and fluid outlet 62. Thermal transfer fluid path 58 includes top serpentine passage 70, bottom serpentine passage 72, and connecting passage 74. Top serpentine passage 70 includes inlet passage 80, first rail passage 82, first raised passage 84, second rail passage 86, second raised passage 88, third rail passage 90, third raised passage 92, fourth rail passage 94, and connecting passage 96. Bottom serpentine passage 72 includes connecting passage 100, fifth rail passage 102, fourth raised passage 104 (not shown in FIG. 5), sixth rail passage 106, fifth raised passage 108 (not shown in FIG. 5), seventh rail passage 110, sixth raised passage 112 (not shown in FIG. 5), eighth rail passage 114, and outlet passage 116. FIG. 5 also shows fuel tank 140 and fuel consumption component 142.

Circuit cards 10 and chassis 12 have the structure and design as described above in reference to FIGS. 1-4B. As shown in FIG. 5, fuel tank 140 is configured to be fluidly coupled to fluid inlet 60, and fuel consumption component 142 is configured to be fluidly coupled to fluid outlet 62. Fuel consumption component 142 can be any component of an aircraft engine that consumes fuel, for example a combustor. In alternate embodiments, fluid outlet 62 can also be fluidly coupled to fuel tank 140. In further alternate embodiments, fuel tank 140 can be any component configured to store a thermal transfer fluid, and fuel consumption component 142 can be any component configured to receive the thermal transfer fluid from chassis 12.

In the embodiment shown in FIG. 5, fuel flows from fuel tank 140 through fuel inlet 60 into thermal transfer fluid path 58 in chassis 12. The fuel then flows in a serpentine pattern through top serpentine passage 70 of thermal transfer fluid path 58. As the fuel flows through top serpentine passage 70, heat from electronic components on circuit cards 10 can be transferred into and absorbed by the fuel. The fuel will then flow from top serpentine passage 70 on top side 30 of chassis 12 through connecting passage 74 in second side 36 of chassis 12 and into bottom serpentine passage 72 on bottom side 32 of chassis 12. The fuel will then flow in a serpentine pattern through bottom serpentine passage 72 of thermal transfer fluid path 58. As the fuel flows through bottom serpentine passage 72, heat from electronic components on circuit cards 10 can be transferred into and absorbed by the fuel.

Top rails 54A, 54D, 54F, and 54I form a part of top serpentine passage 70, and bottom rails 56A, 56D, 56F, and 56I form a part of bottom serpentine passage 72. Heat generated by electronic components on circuit cards 10 can be transferred to the thermal transfer fluid, in this embodiment fuel, flowing through top rails 54A, 54D, 54F, and 54I and bottom rails 56A, 56D, 56F, and 56I to be dissipated out circuit cards 10 and chassis 12. Integrating a portion of thermal transfer fluid path 58 into top rails 54A, 54D, 54F, and 54I and bottom rails 56A, 56D, 56F, and 56I allows heat in circuit cards 10 to dissipate directly from circuit cards 10 through top rails 54A, 54D, 54F, and 54I and bottom rails 56A, 56D, 56F, and 56I and into the thermal transfer fluid flowing through top rails 54A, 54D, 54F, and 54I and bottom rails 56A, 56D, 56F, and 56I. Further, when chassis 12 is used in cold applications, heat from the thermal transfer fluid flowing through top rails 54A, 54D, 54F, and 54I and bottom rails 56A, 56D, 56F, and 56I can be transferred through chassis 12 into the electronic components on circuit cards 10. Chassis 12 provides a direct path for transferring heat between circuit cards 10 and the thermal transfer fluid flowing through thermal transfer fluid path 58. Heat can also transfer from the electronic components on circuit cards 10, into chassis 12, and then into the thermal transfer fluid flowing through thermal transfer fluid path 58 at any point along thermal transfer fluid path 58.

Integrating thermal transfer fluid path 58 into chassis 12 improves the heat transfer capabilities of chassis 12. Efficient heat transfer out of circuit cards 10 and chassis 12 will improve the reliability and extend the life of the electronic components on circuit cards 10. Further, the electronic components on circuit cards 10 can be heated when chassis 12 is used in cold applications to improve reliability of the electronic components on circuit cards 10. Integrating a portion of thermal transfer fluid path 58 into top rails 54 and bottom rails 56 simplifies the manufacturing process of chassis 12, reduces the cost and weight of chassis 12, and maximizes the heat transfer capabilities of chassis 12.

Discussion of Possible Embodiments

The following are non-exclusive descriptions of possible embodiments of the present invention.

A chassis includes top rails extending along a top side of the chassis, bottom rails extending along a bottom side of the chassis, a fluid inlet connected to the chassis that is configured to receive a thermal transfer fluid, and a fluid outlet connected to the chassis that is configured to discharge the thermal transfer fluid. The chassis further includes a thermal transfer fluid path extending between and fluidly coupled to the fluid inlet and the fluid outlet, wherein the thermal transfer fluid is configured to flow through the thermal transfer fluid path, and wherein the thermal transfer fluid path extends in a serpentine pattern through at least one of the top rails and through at least one of the bottom rails.

The chassis of the preceding paragraph can optionally include, additionally and/or alternatively, any one or more of the following features, configurations and/or additional components:

Wherein the thermal transfer fluid path further includes a top serpentine passage extending in a serpentine pattern through the top side of the chassis; a bottom serpentine passage extending in a serpentine pattern through the bottom side of the chassis; and a connecting passage extending through a second side of the chassis and fluidly coupling the top serpentine passage to the bottom serpentine passage.

Wherein the top serpentine passage extends through a plurality of the top rails, and wherein the bottom serpentine passage extends through a plurality of the bottom rails.

Wherein the thermal transfer fluid is fuel.

Wherein the fluid inlet is configured to be fluidly coupled to a fuel tank and wherein the fluid outlet is configured to be fluidly coupled to a fuel consumption component.

A chassis includes a plurality of top rails extending along a top side of the chassis, a plurality of bottom rails extending along a bottom side of the chassis, a fluid inlet connected to the chassis that is configured to receive a thermal transfer fluid, and a fluid outlet connected to the chassis that is configured to discharge the thermal transfer fluid. The chassis further includes a thermal transfer fluid path extending between and fluidly coupled to the fluid inlet and the fluid outlet, wherein the thermal transfer fluid is configured to flow through the thermal transfer fluid path from the fluid inlet to the fluid outlet. The thermal transfer fluid path further includes a top serpentine passage extending in a serpentine pattern through the top side of the chassis, a bottom serpentine passage extending in a serpentine pattern through the bottom side of the chassis, and a connecting passage extending through a second side of the chassis and fluidly coupling the top serpentine passage to the bottom serpentine passage.

The chassis of the preceding paragraph can optionally include, additionally and/or alternatively, any one or more of the following features, configurations and/or additional components:

Wherein the thermal transfer fluid is fuel.

Wherein the top serpentine passage partially extends through the plurality of top rails.

Wherein the top serpentine passage further includes a plurality of raised passages that extend between and fluidly couple the plurality of top rails, wherein the plurality of raised passages extend upwards from a top surface of the top side of the chassis.

Wherein the bottom serpentine passage partially extends through the plurality of bottom rails.

Wherein the bottom serpentine passage further includes a plurality of raised passages that extend between and fluidly couple the plurality of bottom rails, wherein the plurality of raised passages extends downwards from a bottom surface of the bottom side of the chassis.

Wherein the top serpentine passage includes an inlet passage extending through the top side of the chassis and fluidly coupled to the fluid inlet; a first rail passage extending through a first top rail of the plurality of top rails and fluidly coupled to the inlet passage; a first raised passage extending through a first raised portion in the top side of the chassis and fluidly coupled to the first rail passage; and a second rail passage extending through a second top rail of the plurality of top rails and fluidly coupled to the first raised passage.

Wherein the top serpentine passage further includes a second raised passage extending through a second raised portion in the top side of the chassis and fluidly coupled to the second rail passage; a third rail passage extending through a third top rail of the plurality of top rails and fluidly coupled to the second raised passage; a third raised passage extending through a third raised portion in the top side of the chassis and fluidly coupled to the third rail passage; a fourth rail passage extending through a fourth top rail of the plurality of top rails and fluidly coupled to the third raised passage; and a top connecting passage extending through the top side of the chassis and fluidly coupled to the fourth rail passage and the connecting passage in the second side of the chassis.

Wherein the bottom serpentine passage includes a bottom connecting passage extending through the bottom side of the chassis and fluidly coupled to the connecting passage in the second side of the chassis; a fifth rail passage extending through a first bottom rail of the plurality of bottom rails and fluidly coupled to the bottom connecting passage; a fourth raised passage extending through a fourth raised portion in the bottom side of the chassis and fluidly coupled to the fifth rail passage; and a sixth rail passage extending through a second bottom rail of the plurality of bottom rails and fluidly coupled to the fourth raised passage.

Wherein the bottom serpentine passage further includes a fifth raised passage extending through a fifth raised portion in the bottom side of the chassis and fluidly coupled to the sixth rail passage; a seventh rail passage extending through a third bottom rail of the plurality of bottom rails and fluidly coupled to the fifth raised passage; a sixth raised passage extending through a sixth raised portion in the bottom side of the chassis and fluidly coupled to the seventh rail passage; a eighth rail passage extending through a fourth bottom rail of the plurality of bottom rails and fluidly coupled to the sixth raised passage; and a outlet passage extending through the bottom side of the chassis and fluidly coupled to the eight rail passage and to the fluid outlet.

A method of thermally managing components in a chassis includes providing a thermal transfer fluid to a fluid inlet fluidly coupled to a thermal transfer fluid path in the chassis, and flowing the thermal transfer fluid in a serpentine pattern through the thermal transfer fluid path in the chassis. The method further includes transferring heat from an electronic component on a circuit card held in the chassis and into the thermal transfer fluid flowing through the thermal transfer fluid path in the chassis, and discharging the thermal transfer fluid from the thermal transfer fluid path through a fluid outlet fluidly coupled to the thermal transfer fluid path in the chassis.

The method of the preceding paragraph can optionally include, additionally and/or alternatively, any one or more of the following features, configurations and/or additional components:

Wherein the circuit card is held in the chassis against a top rail and a bottom rail, and wherein the top rail and the bottom rail form a part of the thermal transfer fluid path.

Wherein transferring heat from the electronic component on the circuit card held in the chassis and into the thermal transfer fluid flowing through the chassis further comprises transferring heat from the electronic component into the thermal transfer fluid flowing through the top rail and/or the bottom rail of the chassis.

Wherein flowing the thermal transfer fluid in a serpentine pattern through the thermal transfer fluid path in the chassis further includes flowing the thermal transfer fluid along a first serpentine passage extending through a top side of the chassis; flowing the thermal transfer fluid along a connecting passage extending through a side of the chassis; and flowing the thermal transfer fluid along a second serpentine passage extending through a bottom side of the chassis.

Wherein providing a thermal transfer fluid to a fluid inlet fluidly coupled to a thermal transfer fluid path in the chassis includes providing fuel to a fluid inlet from a fuel tank of an aircraft, and wherein discharging the thermal transfer fluid from the thermal transfer fluid path through a fluid outlet fluidly coupled to the thermal transfer fluid path in the chassis includes discharging the fuel to a fuel consumption component of an aircraft.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A chassis comprising:
   top rails extending along a top side of the chassis;
   bottom rails extending along a bottom side of the chassis;
   a fluid inlet connected to the chassis that is configured to receive a thermal transfer fluid;
   a fluid outlet connected to the chassis that is configured to discharge the thermal transfer fluid;
   a thermal transfer fluid path extending between and fluidly coupled to the fluid inlet and the fluid outlet, wherein the thermal transfer fluid is configured to flow through the thermal transfer fluid path, and wherein the thermal transfer fluid path extends in a serpentine pattern through at least one of the top rails and through at least one of the bottom rails, the thermal transfer fluid path comprising:
      a top serpentine passage extending in a serpentine pattern through the top side of the chassis and partially extending through the top rails, wherein the top serpentine passage further includes a plurality of raised passages that extend between and fluidly couple the top rails, wherein the plurality of raised passages extend upwards from a top surface of the top side of the chassis.

2. The chassis of claim 1, wherein the thermal transfer fluid path further comprises:
   a bottom serpentine passage extending in a serpentine pattern through the bottom side of the chassis; and
   a connecting passage extending through a side of the chassis which extends between the top side and the bottom side, and fluidly coupling the top serpentine passage to the bottom serpentine passage.

3. The chassis of claim 2, wherein the top serpentine passage extends through a plurality of the top rails, and wherein the bottom serpentine passage extends through a plurality of the bottom rails.

4. The chassis of claim 1, wherein the thermal transfer fluid is fuel.

5. The chassis of claim 4, wherein the fluid inlet is configured to be fluidly coupled to a fuel tank, and wherein the fluid outlet is configured to be fluidly coupled to a fuel consumption component.

6. A chassis comprising:
   a plurality of top rails extending along a top side of the chassis;
   a plurality of bottom rails extending along a bottom side of the chassis;
   a fluid inlet connected to the chassis that is configured to receive a thermal transfer fluid;
   a fluid outlet connected to the chassis that is configured to discharge the thermal transfer fluid; and a thermal transfer fluid path extending between and fluidly coupled to the fluid inlet and the fluid outlet, wherein the thermal transfer fluid is configured to flow through the thermal transfer fluid path from the fluid inlet to the fluid outlet, and wherein the thermal transfer fluid path further includes:
  a top serpentine passage extending in a serpentine pattern through the top side of the chassis and partially extending through the plurality of top rails, wherein the top serpentine passage further includes a plurality of raised passages that extend between and fluidly couple the plurality of top rails, wherein the plurality of raised passages extend upwards from a top surface of the top side of the chassis;
  a bottom serpentine passage extending in a serpentine pattern through the bottom side of the chassis; and
  a connecting passage extending through a side of the chassis which extends between the top side and the bottom side, and fluidly coupling the top serpentine passage to the bottom serpentine passage.

7. The chassis of claim 6, wherein the thermal transfer fluid is fuel.

8. The chassis of claim 6, wherein the bottom serpentine passage partially extends through the plurality of bottom rails.

9. The chassis of claim 8, wherein the bottom serpentine passage further includes a plurality of raised passages that extend between and fluidly couple the plurality of bottom rails, wherein the plurality of raised passages extends downwards from a bottom surface of the bottom side of the chassis.

10. The chassis of claim 6, wherein the top serpentine passage comprises:
  an inlet passage extending through the top side of the chassis and fluidly coupled to the fluid inlet;
  a first rail passage extending through a first top rail of the plurality of top rails and fluidly coupled to the inlet passage;
  a first raised passage of the plurality of raised passages extending through a first raised portion in the top side of the chassis and fluidly coupled to the first rail passage; and
  a second rail passage extending through a second top rail of the plurality of top rails and fluidly coupled to the first raised passage.

11. The chassis of claim 10, wherein the top serpentine passage further comprises:
  a second raised passage of the plurality of raised passages extending through a second raised portion in the top side of the chassis and fluidly coupled to the second rail passage;
  a third rail passage extending through a third top rail of the plurality of top rails and fluidly coupled to the second raised passage;
  a third raised passage of the plurality of raised passages extending through a third raised portion in the top side of the chassis and fluidly coupled to the third rail passage;
  a fourth rail passage extending through a fourth top rail of the plurality of top rails and fluidly coupled to the third raised passage; and
  a top connecting passage extending through the top side of the chassis and fluidly coupled to the fourth rail passage and the connecting passage in the second side of the chassis.

12. The chassis of claim 6, wherein the bottom serpentine passage comprises:
  a bottom connecting passage extending through the bottom side of the chassis and fluidly coupled to the connecting passage in the side of the chassis which extends between the top side and the bottom side;
  a fifth rail passage extending through a first bottom rail of the plurality of bottom rails and fluidly coupled to the bottom connecting passage;
  a fourth raised passage extending through a fourth raised portion in the bottom side of the chassis and fluidly coupled to the fifth rail passage; and
  a sixth rail passage extending through a second bottom rail of the plurality of bottom rails and fluidly coupled to the fourth raised passage.

13. The chassis of claim 12, wherein the bottom serpentine passage further comprises:
  a fifth raised passage extending through a fifth raised portion in the bottom side of the chassis and fluidly coupled to the sixth rail passage;
  a seventh rail passage extending through a third bottom rail of the plurality of bottom rails and fluidly coupled to the fifth raised passage;
  a sixth raised passage extending through a sixth raised portion in the bottom side of the chassis and fluidly coupled to the seventh rail passage;
  an eighth rail passage extending through a fourth bottom rail of the plurality of bottom rails and fluidly coupled to the sixth raised passage; and
  an outlet passage extending through the bottom side of the chassis and fluidly coupled to the eighth rail passage and to the fluid outlet.

14. A method of thermally managing electronic components in a chassis, the method comprising:
  providing a thermal transfer fluid to a fluid inlet fluidly coupled to a thermal transfer fluid path in the chassis, the thermal transfer fluid path extending in a serpentine pattern through at least one of a plurality of bottom rails extending along a bottom side of the chassis and further comprising:
    a first serpentine passage extending in a serpentine pattern through a top side of the chassis and partially extending through a plurality of top rails, wherein the first serpentine passage includes a plurality of raised passages that extend between and fluidly couple the plurality of top rails, the plurality of raised passages extending upwards from a top surface of the top side of the chassis;
  flowing the thermal transfer fluid in the serpentine patterns through the thermal transfer fluid path in the chassis through the at least one of the plurality of top rails and the at least one of the plurality of bottom rails, thereby flowing the thermal transfer fluid along the first serpentine passage extending through the top side of the chassis;
  transferring heat from an electronic component on a circuit card held in the chassis and into the thermal transfer fluid flowing through the thermal transfer fluid path in the chassis; and
  discharging the thermal transfer fluid from the thermal transfer fluid path through a fluid outlet fluidly coupled to the thermal transfer fluid path in the chassis.

15. The method of claim 14, wherein the circuit card is held in the chassis against a top rail of the plurality of top rails and a bottom rail of the plurality of bottom rails, and wherein the top rail and the bottom rail form a part of the thermal transfer fluid path.

16. The method of claim 15, wherein transferring heat from the electronic component on the circuit card held in the chassis and into the thermal transfer fluid flowing through the chassis further comprises:
- transferring heat from the electronic component into the thermal transfer fluid flowing through the top rail and/or the bottom rail of the chassis.

17. The method of claim 14, wherein flowing the thermal transfer fluid in the serpentine patterns through the thermal transfer fluid path in the chassis further comprises:
- flowing the thermal transfer fluid along the first serpentine passage extending through the top side of the chassis;
- flowing the thermal transfer fluid along a connecting passage extending through a side of the chassis which extends between the top side of the chassis and the bottom side of the chassis; and
- flowing the thermal transfer fluid along a second serpentine passage extending through the bottom side of the chassis.

18. The method of claim 14, wherein providing a thermal transfer fluid to a fluid inlet fluidly coupled to a thermal transfer fluid path in the chassis includes providing fuel to a fluid inlet from a fuel tank of an aircraft, and wherein discharging the thermal transfer fluid from the thermal transfer fluid path through a fluid outlet fluidly coupled to the thermal transfer fluid path in the chassis includes discharging the fuel to a fuel consumption component of an aircraft.

* * * * *